(12) United States Patent
Ben Salah et al.

(10) Patent No.: US 11,060,178 B2
(45) Date of Patent: Jul. 13, 2021

(54) METHOD FOR PRODUCING A THERMAL BARRIER SYSTEM ON A METAL SUBSTRATE OF A TURBO ENGINE PART

(71) Applicant: Safran, Paris (FR)

(72) Inventors: Nihad Ben Salah, Moissy-Cramayel (FR); Jawad Badreddine, Moissy-Cramayel (FR); Aurélian Joulia, Moissy-Cramayel (FR)

(73) Assignee: SAFRAN, Paris (FR)

( * ) Notice: Subject to any disclaimer, the term of this patent is extended or adjusted under 35 U.S.C. 154(b) by 0 days.

(21) Appl. No.: 16/326,585

(22) PCT Filed: Aug. 25, 2017

(86) PCT No.: PCT/FR2017/052284
§ 371 (c)(1),
(2) Date: Mar. 12, 2019

(87) PCT Pub. No.: WO2018/037196
PCT Pub. Date: Mar. 1, 2018

(65) Prior Publication Data
US 2019/0211438 A1  Jul. 11, 2019

(30) Foreign Application Priority Data

Aug. 25, 2016 (FR) ....................... 1657941

(51) Int. Cl.
*C23C 14/08* (2006.01)
*C23C 4/134* (2016.01)
*C23C 4/073* (2016.01)
*C23C 14/58* (2006.01)
*C23C 28/00* (2006.01)
*F01D 5/28* (2006.01)

(52) U.S. Cl.
CPC ............ *C23C 14/083* (2013.01); *C23C 4/073* (2016.01); *C23C 4/134* (2016.01); *C23C 14/5813* (2013.01); *C23C 14/5886* (2013.01); *C23C 28/3215* (2013.01); *C23C 28/3455* (2013.01); *F01D 5/286* (2013.01); *F05B 2230/90* (2013.01); *F05B 2280/10741* (2013.01)

(58) Field of Classification Search
CPC ....... C23C 14/083; C23C 4/073; C23C 4/134; C23C 14/5813; C23C 14/4886
See application file for complete search history.

(56) References Cited

U.S. PATENT DOCUMENTS

| 5,015,502 | A | * | 5/1991 | Strangman | ............ | C23C 14/083 |
| | | | | | | 427/248.1 |
| 5,350,599 | A | * | 9/1994 | Rigney | ................... | F01D 5/288 |
| | | | | | | 427/255.7 |
| 6,667,114 | B2 | * | 12/2003 | Grylls | ...................... | C23C 4/08 |
| | | | | | | 428/632 |

(Continued)

*Primary Examiner* — Dah-Wei D. Yuan
*Assistant Examiner* — Kristen A Dagenais-Englehart
(74) *Attorney, Agent, or Firm* — Womble Bond Dickinson (US) LLP

(57) ABSTRACT

Method for producing a thermal barrier system on a metal substrate (1) of a turbo engine part, such as a high-pressure turbine blade, the thermal barrier system comprising at least one columnar ceramic layer (31, . . . , 3*i*, . . . , 3*n*), characterised in that the method comprises a step of compressing at least one of said at least one columnar ceramic layer (31, . . . 3*i*, . . . , 3*n*).

19 Claims, 2 Drawing Sheets

(56) References Cited

U.S. PATENT DOCUMENTS

| | | | |
|---|---|---|---|
| 2004/0067320 A1* | 4/2004 | Spitsberg | C23C 28/321 |
| | | | 427/404 |
| 2010/0028711 A1* | 2/2010 | Helmick | F01D 5/288 |
| | | | 428/623 |

* cited by examiner

METHOD FOR PRODUCING A THERMAL BARRIER SYSTEM ON A METAL SUBSTRATE OF A TURBO ENGINE PART

TECHNICAL FIELD

The field of the present invention is that of turbo engines, and more specifically that of parts for these turbo engines that are subjected to high temperatures, such as high-pressure turbine blades.

STATE OF THE ART

A turbo engine, such as used for propulsion in the aeronautics field, comprises an atmospheric air inlet that communicates with one or more compressors, of which generally a fan driven in rotation about one same axis. The primary flow of this air, after having been compressed, feeds a combustion chamber arranged annularly about this axis and is mixed with a fuel to supply hot gases, downstream, to one or more turbines through which the latter are expanded, with the turbine rotors driving the rotors of the compressors. The motors operate at a temperature of the hot gases at the turbine inlet that is sought to be as high as possible, as this temperature conditions the performance of the turbo engine. With this aim, the materials of the hot portions are selected to resist these operating conditions and the walls of the parts swept by the hot gases, such as the distributors or the mobile turbine blades, are provided with cooling means. Moreover, due to the nickel or cobalt-based superalloy-based metallic constitution of these blades, it is also necessary to protect them from erosion and corrosion which are generated by the constituents of the hot gases at these temperatures.

Among the protections designed to make it possible for these parts to resist these extreme conditions, is the deposition of several materials forming a "thermal barrier system", on the external face thereof. A thermal barrier system is generally comprised of a ceramic layer of about one hundred microns, which is deposited onto the surface of the metallic layer. An aluminium sublayer, called bonding layer, of a few tens of microns, placed between the ceramic and the metallic substrate, completes the thermal barrier by improving the bond between these two components as well as the protection of the underlying metal from oxidation. This aluminium sublayer, which is generally deposited via a vapour phase aluminiding method, is fixed to the substrate via metallic inter-diffusion and forms a protective oxide layer on the surface. An example of the implementation of this technique is described in document FR 2928664.

As for the thermal barrier per se, made of ceramic, it can be produced in several ways, according to the use that will be made of it. There are roughly two types of structures for thermal barriers: columnar barriers of which the structure is that of columns juxtaposed next to one another and which extend perpendicularly to the surface of the substrate, and lamellar or isotropic barriers which extend as uniform layers over the surface of the substrate.

Columnar barriers are generally produced by a method referred to as EBPVD (Electron Beam Physical Vapour Deposition) in which a target anode is bombarded, in a high vacuum, by an electron beam emitted by a loaded tungsten filament. The electron beam changes the molecules of the target to the gas phase. These molecules thus precipitate in a solid form, covering the part to be protected with a thin layer of the material of the anode. These thermal barriers are characterised by good thermal resistance but also a relatively high thermal conductivity.

The thermal barrier system ages, due to the combined phenomena of cyclical oxidation, erosion, exposure to an environment rich in a set of oxide particles commonly referred to as CMAS (for oxides of calcium, magnesium, aluminium and silicon). The ageing results in a rapid degradation of the system.

Multiple mechanisms are produced, and in particular:
an increase in the roughness of the bonding layer, due to the increasing oxidation, resulting in the detachment of the thermal barrier,
the infiltration of the CMAS oxides into the intercolumnar spaces of the ceramic, causing the weakening thereof,
a low resistance to impacts with foreign bodies, due to the low tenacity of the ceramic materials.

Document V HAROK ET AL.: "Elastic and inelastic effects in compression in plasma-sprayed ceramic coatings", JOURNAL OF THERMAL SPRAY TECHNOLOGY, vol. 10, no. 1, 1 Mar. 2001, pages 126-132, is the study of the compression of a zircon coating obtained by plasma burner thermal spraying. This document does not describe the compression of a columnar ceramic layer in a thermal barrier system.

Document EP 1 531 232 A2 describes a method for repairing a damaged thermal barrier system. This document mentions the possibility of the removal of the thermal barrier by an abrasive method using glass beads, but does not disclose compression shot blasting of a columnar ceramic layer in a thermal barrier system.

Document WO 2009/127725 A1 describes a method of shot blasting via ultrasound of a metallic surface comprising a surface that is difficult to access. This document also does not describe the compression of a columnar ceramic layer in a thermal barrier system.

The present invention aims to overcome these disadvantages, by proposing a method for producing a thermal barrier system that makes it possible to combat the ageing of the system.

SUMMARY OF THE INVENTION

The invention thus has, as an aim, a method for producing a thermal barrier system on a metal substrate of a turbo engine part, such as a high-pressure turbine blade, the thermal barrier system comprising at least one columnar ceramic layer.

According to the invention, the method comprises a step of compressing at least one of said at least one columnar ceramic layer. The compression can be partial or total. The compressed ceramic layer thus comprises at least one compressed portion.

Document T. Frey and W. Pfeiffer, "Shot peening of Ceramics: Damage or Benefit?", *International Conference on Shot Peening*, 2002, pp. 1-10, indicates that introducing compressive stresses by shot blasting in ceramics is possible without damaging them.

The compression step is used in the invention in a specific ceramic, and for a very specific purpose, which is not considered by the state of the art: tightening the spaces between the columns of one or more columnar ceramic layers, which have the effect of limiting the infiltration of the CMAS oxides, increasing the service life of the thermal barrier system, and improving the mechanical properties of the thermal barrier system.

The compression is capable of reducing the spaces between the columns of the compressed columnar ceramic layer or layers. The compression induces a deformation effect at the surface of the compressed layer(s), said deformation resulting in a reduction in the spaces between the columns.

The compression can be, for example, a shot blasting, a shot peening or a compression by laser shock peening.

The compression of at least one of said columnar ceramic layer can be a shot blasting and the Almen intensity of said shot blasting is advantageously between F10A and F42A.

This is a technological benchmark developed by Almen (General Motors, USA) and universally adopted (AFNOR NFL 06-832 standard). A test piece made of quenched and tempered carbon steel of the XC65 type is used, clamped onto a support and exposed to a stream of shot, in the immediate vicinity of the parts to be shot blast. When the test piece is released from the clamps thereof, it is deformed because the shot blasted face is extended. A characteristic bending is thus observed called Almen bend. The standards define three types of test pieces N, A, C. By way of example, a shot blasting with Almen intensity F15A means F: French Standard, 15: arc-height of 0.15 mm, A: type A test piece.

To obtain this intensity, the following parameters can be used, alone or preferably in a combination:
- micro-beads of spherical shape (shot blasting is a technique that consists of projecting, using a shot blasting machine, micro-beads on the surface of an object in order to modify the surface structure thereof and to introduce compressive stresses),
- material of the micro-beads: WC, $ZrO_2$, $SiO_2$, $Al_2O_3$, steel,
- the size of the beads is between 300 µm and 1 mm for a shot blasting with a nozzle, between 0.8 and 3 mm for a shot blasting with ultrasound, and between 1 and 6 mm for a vibro-shot blasting,
- the angles of incidence for the shot blasting with a nozzle are between 60 and 90°.

Said substrate is typically a nickel or cobalt-based superalloy substrate.

Said at least one columnar ceramic layer can be a layer of yttriated zirconia.

Said at least one columnar ceramic layer can be obtained by physical vapour deposition.

The physical vapour deposition can be an electron beam physical vapour deposition (EBPVD).

The thermal barrier system can comprise one or more columnar ceramic layers, and the method can comprise the compression of one or of all of the columnar ceramic layers.

The method can in particular comprise the compression of the upper ceramic layer or the compression of the ceramic layer located directly under said upper layer.

The thermal barrier system can further comprise a bonding layer arranged between said metal substrate and said at least one columnar ceramic layer.

Said bonding layer can be a layer of material, in particular an aluminium-forming material, comprising an alumina layer on the surface.

The method can comprise a step of compressing said bonding layer. When the compression of said bonding layer is by shot blasting, the Almen intensity of the shot blasting is advantageously between F9N and F30A.

The method can successively comprise:
- the forming of a bonding layer on the metallic substrate, the bonding layer being able to be compressed,
- the forming, on the bonding layer, of one or more ceramic layers, at least one of the said ceramic layer or layers being able to be compressed.

The invention also has as an aim, a turbo engine part, such as a high-pressure turbine blade. Said turbo engine part comprises a thermal barrier system produced by a method described hereinabove. The blade can be, for example, a high-pressure turbine fixed blade or mobile blade.

DESCRIPTION OF THE FIGURES

The invention will be better understood and other details, characteristics and advantages of the invention will appear upon reading the following description provided as a non-limiting example and in reference to the appended drawings, wherein.

DETAILED DESCRIPTION

Figure 1:
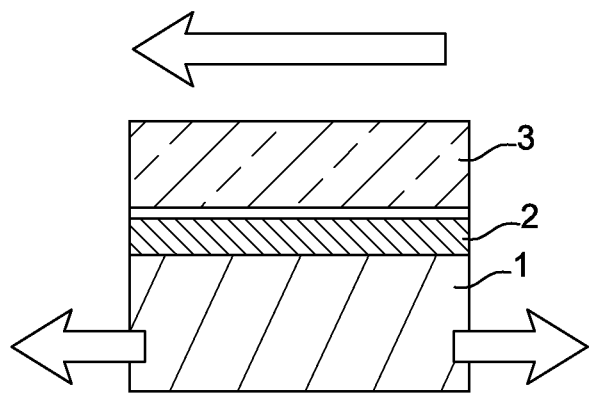
FIG. 1 is a schematic, cross-sectional view of a thermal barrier system of a state of the art turbo engine blade.

FIG. 1 shows a cross-sectional view of the composition of a thermal barrier system arranged on the surface of a turbine blade, with the latter being bathed by a flow of hot gas represented by an arrow directed towards the left of the figure. The metal that forms the blade, typically a nickel or cobalt-based superalloy, forms a substrate 1 on which is deposited a sublayer made of aluminium 2, referred to as bonding layer, sandwiched between the substrate 1 and a ceramic layer 3. The function of the bonding layer 2 is to retain the ceramic layer 3 and to offer a certain elasticity to the whole in order to make it possible for it to absorb the difference in dilatation, represented by two arrows in the opposite direction, existing between the substrate 1 with high dilatation and the ceramic 3 with low dilatation.

The bonding layer 2 can be of the MCrAlY formula, wherein M designates Fe, Ni, Co and mixtures thereof. It can be obtained by conventional plasma spraying, for example of the APS (Air Plasma Spraying) type. The bonding layer 2 of the MCrAlY type can be replaced with a nickel aluminide or modified with platinum, or with a layer of the gamma/gamma'-MCrAlY type.

The ceramic 3 shown here has a columnar structure, which enables lateral movements, due to the appearance of cracks between the columns, and which provides it with a good service life. The aluminium is then put into contact with the oxygen conveyed by the gases that circulate in the stream of the turbo engine, which results in a mediocre thermal conductivity of the barrier and progressive damage to the latter.

The ceramic coating can be formed from a stack of one or more layers, produced for example by an electron beam physical vapour deposition (EBPVD). The first ceramic layer is preferably with a yttriated zirconia base that is partially stabilised (YSZ). For the other ceramic layers, different types of layers can be considered:

- a mono-oxide, such as for example $Al_2O_3$ or $Y_2O_3$,
- a zirconia doped with one or more rare-earth oxides,
- a rare-earth zirconate, such as for example $Gd_2Zr_2O_7$, $Sm_2Zr_2O_7$ or $Yb_4Zr_3O_{12}$,
- a perovskite, such as for example $Ba(Mg_{1/3}Ta_{2/3})O_3$, $La(Al_{1/4}Mg_{1/2}Ta_{1/4})O_3$,
- a hexaaluminate, for example of the general formula $REMAl_{11}O_{19}$, wherein RE designates an element ranging from La to Gd in the periodic table, and M designates an element chosen from Mg, Mn to Zn, Cr and Sm,
- lanthanide orthophosphates.

The thermal barrier system functions to prolong the service life of the blade and to increase the temperature of the gases, and therefore the output of the engine. In service, the structure and the composition of the various constituents of the system change under the action of the sintering of the ceramic layer, of the oxidation of the bonding layer and of the interdiffusion phenomena with the substrate, with consequently a modification in the properties of the various layers and an alteration of the resistance of the interfacial zone. These modifications, associated with the external thermo-mechanical stresses, are at the origin of the roughness of the bonding layer leading to delaminations at the bonding/ceramic layer interface, and, in the end, to the flaking of the thermal barrier system. These degradation processes can be accelerated by the interactions with the external environment.

To overcome this, and according to the invention, the compression of at least one columnar ceramic layer is carried out.

Figure 2:
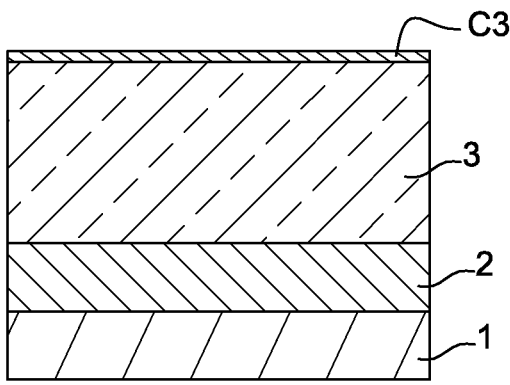
FIGS. 2 and 3 are schematic, cross-sectional views of a thermal barrier system produced according to a method according to the invention, according to two alternatives of a first embodiment.

In a first embodiment, the compression of the upper columnar ceramic layer is carried out. Such as shown in FIG. 2, the ceramic coating comprises a single ceramic layer 3, for example of the YSZ type. The ceramic layer 3 undergoes a compression operation C3, so as to tighten the intercolumnar spaces at the surface, which have the effect of:

- a limitation of the infiltration of the CMAS oxides,
- an increase in the service life of the thermal barrier system,
- an improvement in the mechanical properties, such as the surface hardness,
- an increase in the resistance to erosion, and
- an increase in the tenacity of the thermal barrier system.

The compression of the ceramic layer 3 is symbolised in FIG. 2 by the reference C3 showing a compressed layer portion. The layer 3 can be compressed partially or entirely, i.e. over all or a portion of the height of the layer 3.

Figure 3:
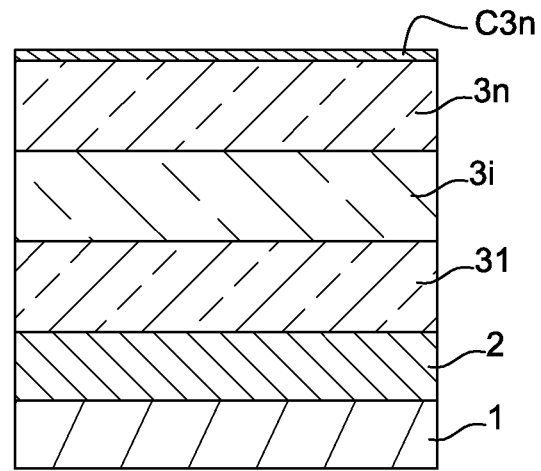

In the alternative shown in FIG. 3, the ceramic coating comprises a plurality of n ceramic layers. A lower layer 31 rests on the bonding layer 2. In the direction of the surface of the thermal barrier system, there is an intermediate layer 3i and the upper layer 3n. The compression of the upper ceramic layer 3n is symbolised in FIG. 2 by the reference C3n. The layer 3n can be compressed partially or entirely, i.e. over all or a portion of the height of the layer 3n. The compression C3n makes it possible to tighten the intercolumnar spaces at the surface of the thermal barrier system and achieves the same advantages as those mentioned for FIG. 2.

Figure 4:
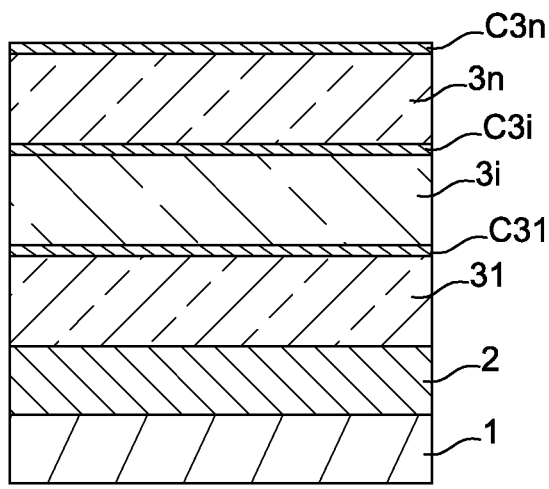
FIG. 4 is a schematic, cross-sectional view of a thermal barrier system produced according to a method according to the invention, according to a second embodiment.

In a second embodiment, shown in FIG. 4, each layer of the ceramic coating that comprises n layers is subjected to a compression, partially or entirely. Thus, the first layer 31, for example of the YSZ type, is subjected to a compression C31, each intermediate layer 3i is subjected to a compression C3i and the upper layer 3n is subjected to a compression C3n.

The substrate 1 of the turbine blade is covered beforehand or not with a bonding layer 2 of the MCrAlY type, M designating Fe, Ni, Co and mixtures thereof. The bonding layer 2 can be obtained by conventional plasma spraying, for example of the APS (Air Plasma Spraying) type. The bonding layer 2 of the MCrAlY type can be replaced with a nickel aluminide or modified with platinum, or with a layer of the gamma/gamma'-MCrAlY type.

The ceramic coating is formed from a stack of n layers 31, ..., 3i, ..., 3n, produced by the electron beam physical vapour deposition (EBPVD) method. The first layer 3i is preferably an yttriated zirconia base that is partially stabilised.

After the production of each ceramic layer by EBPVD, a compression operation is carried out that makes it possible to obtain a less rough surface condition, which has the effect of improving the regermination of smaller columns and of intercolumnar spaces that are increasingly tighter as the upper layers are formed. These compressions result in:

- a limitation in the infiltration of the CMAS oxides;
- an increase in the service life of the thermal barrier system, and
- an increase in the tenacity of the thermal barrier system.

Figure 5:
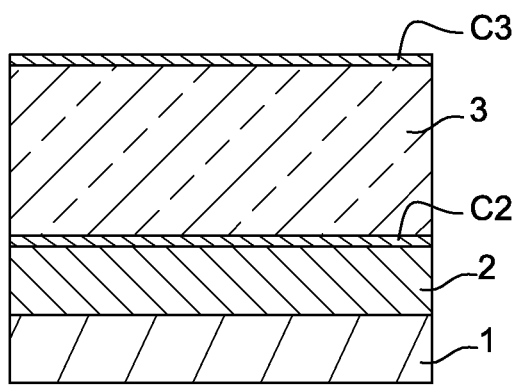
FIGS. 5 and 6 are schematic, cross-sectional views of a thermal barrier system produced according to a method according to the invention, according to two alternatives of a third embodiment.
Figure 6:
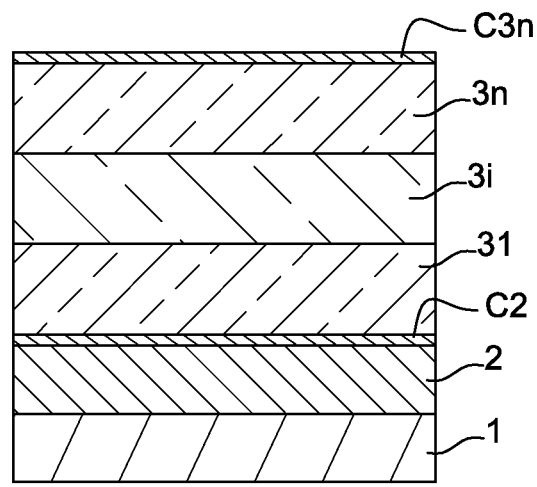

In a third embodiment, shown in FIGS. 5 and 6, the bonding layer of the thermal barrier system of the two alternatives of the first embodiment is also subjected to a partial or total compression. Thus, the thermal barrier system has both the bonding layer thereof and the upper ceramic layer thereof placed in compression. FIG. 5 shows the thermal barrier system with a single ceramic layer 3, while FIG. 6 shows the thermal barrier system with n ceramic layers 31, ..., 3i, ..., 3n.

The substrate 1 of the turbine blade is coated beforehand with a bonding layer 2 of the MCrAlY type, M designating Fe, Ni, Co and mixtures thereof. The bonding layer 2 can be obtained by conventional plasma spraying, for example of the APS (Air Plasma Spraying) type. The bonding layer 2 of the MCrAlY type can be replaced with a nickel aluminide or modified with platinum, or with a layer of the gamma/gamma'-MCrAlY type.

The compression of the bonding layer 2 makes it possible for:

- a partial or total densification of the bonding layer 2 and a control of the roughness thereof, with the benefit of the reduction in the deformation kinetics of this layer during the thermal cycle;
- the generation of residual stresses that have the effect of an increase in the hardness of the layer 2.

Figure 7:
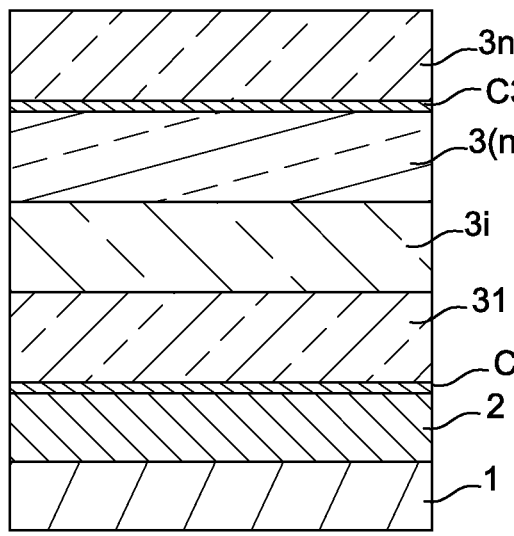
FIG. 7 is a schematic, cross-sectional view of a thermal barrier system produced according to a method according to the invention, according to a fourth embodiment.

In a fourth embodiment, shown in FIG. 7, the bonding layer 2 and the penultimate upper ceramic layer 3(n−1) are partially or entirely subjected to a compression C2 and C3(n−1) respectively.

Figure 8:
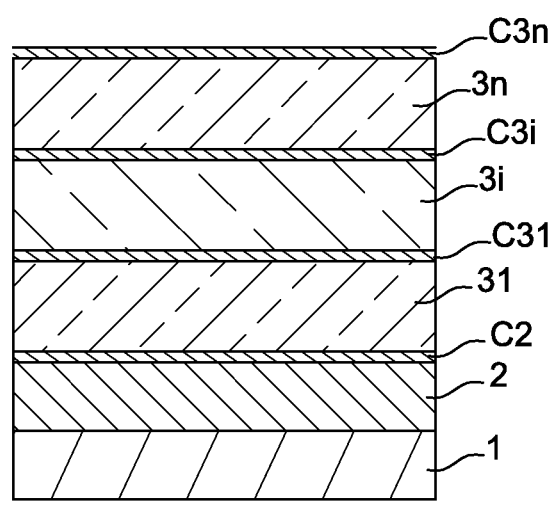
FIG. 8 is a schematic, cross-sectional view of a thermal barrier system produced according to a method according to the invention, according to a fifth embodiment.

Finally, in a fifth embodiment, the bonding layer 2 and all of the ceramic layers 31, ..., 3i, ..., 3n are subjected to a compression (FIG. 8).

The invention claimed is:

1. A method for producing a thermal barrier system on a metal substrate of a turbine engine part, said thermal barrier system comprising a stack of a plurality of columnar ceramic layers which have an upper ceramic layer and at least one intermediate ceramic layer arranged under said upper ceramic layer, said upper ceramic layer forming a top of said stack of plurality of columnar ceramic layers, said upper ceramic layer comprising a lower surface which is in contact with said at least one intermediate ceramic layer and an upper surface which is not in contact with any layer, said at least one intermediate ceramic layer being arranged between said upper ceramic layer and said metal substrate, the method comprising the steps of:
- successively depositing said plurality of columnar ceramic layers on said metal substrate,
- stacking said at least one intermediate ceramic layer on said metal substrate,
- compressing said at least one intermediate ceramic layer to tighten spaces between columns of said at least one intermediate ceramic layer, and
- stacking said upper ceramic layer on said at least one intermediate ceramic layer.

2. The method according to claim 1, wherein the compression is a shot peening, a microbeads peening or a compression by laser shock peening.

3. The method according to claim 2, wherein the compression said at least one intermediate ceramic layer is a shot peening and in that the Almen intensity of said shot peening is between F10A and F42A.

4. The method according to claim 1, wherein said substrate is a nickel or cobalt-based superalloy substrate.

5. The method according to claim 1, wherein at least one of said plurality columnar ceramic layers is a layer of yttriated zirconia.

6. The method according to claim 1, wherein said plurality columnar ceramic layers are obtained by physical vapour deposition.

7. The method according to claim 6, wherein the vapour deposition is an electron beam physical vapour deposition (EBPVD).

8. The method according to claim 1, wherein the method comprises the compression of said upper ceramic layer.

9. The method according to claim 1, wherein the thermal barrier system further comprises a bonding layer arranged between said metal substrate and said plurality columnar ceramic layers.

10. The method according to claim 9, wherein said bonding layer is a layer of an aluminium-forming material comprising an alumina layer on the surface.

11. The method according to claim 9, wherein the method comprises a step of compressing said bonding layer.

12. The method according to claim 11, wherein the compression of said bonding layer is a shot peening and in that the Almen intensity of said shot peening is between F9N and F30A.

13. The method according to claim 1, wherein said turbine engine part is a high pressure turbine blade.

14. The method according to claim 1, wherein the compression of one or more of said at least one intermediate ceramic layers is partial or total.

15. The method according to claim 1, wherein said at least one intermediate ceramic layer is located directly under said upper ceramic layer.

16. The method according to claim 1, wherein the method comprises a step of compressing said upper ceramic layer to tighten spaces between columns of said upper ceramic layer.

17. The method according to claim 9, wherein said bonding layer is sandwiched between said metal substrate and said at least one intermediate ceramic layer.

18. The method according to claim 9, wherein said stack of plurality of columnar ceramic layers comprise also a lower ceramic layer which rests on said bonding layer, said lower ceramic layer being arranged under said at least one intermediate ceramic layer.

19. The method according to claim 18, wherein the method comprises a step of compressing said lower ceramic layer to tighten spaces between columns of said lower ceramic layer.

* * * * *